United States Patent
Chapek

[11] Patent Number: 6,143,631
[45] Date of Patent: Nov. 7, 2000

[54] METHOD FOR CONTROLLING THE MORPHOLOGY OF DEPOSITED SILICON ON A SILICON DIOXIDE SUBSTRATE AND SEMICONDUCTOR DEVICES INCORPORATING SUCH DEPOSITED SILICON

[75] Inventor: David L. Chapek, Nashua, N.H.

[73] Assignee: Micron Technology, Inc., Boise, Id.

[21] Appl. No.: 09/072,262

[22] Filed: May 4, 1998

[51] Int. Cl.[7] ................................................ H01L 21/265
[52] U.S. Cl. .......................... 438/513; 438/528; 438/798
[58] Field of Search ................................. 438/475, 513, 438/520, 528, 798, 953, 162, 216, 287, 378

[56] References Cited

U.S. PATENT DOCUMENTS

| | | | |
|---|---|---|---|
| 3,849,204 | 11/1974 | Fowler | 438/798 |
| 3,852,120 | 12/1974 | Johnson et al. | 438/475 |
| 4,272,303 | 6/1981 | Chatterjee et al. | |
| 4,447,272 | 5/1984 | Saks | 438/798 |
| 4,764,394 | 8/1988 | Conrad | |
| 5,273,920 | 12/1993 | Kwasnick et al. | 438/798 |
| 5,354,381 | 10/1994 | Sheng | |
| 5,403,756 | 4/1995 | Yoshinouchi et al. | 438/162 |
| 5,498,290 | 3/1996 | Matossian et al. | |
| 5,500,102 | 3/1996 | Ichikawa et al. | |
| 5,508,227 | 4/1996 | Chen et al. | 438/162 |
| 5,558,718 | 9/1996 | Leung | |
| 5,576,229 | 11/1996 | Murata et al. | 438/162 |
| 5,602,047 | 2/1997 | Tsai et al. | |
| 5,607,509 | 3/1997 | Schumacher et al. | |
| 5,626,922 | 5/1997 | Miyanaga et al. | |
| 5,627,085 | 5/1997 | Gosain et al. | |
| 5,672,541 | 9/1997 | Booske et al. | |
| 5,686,335 | 11/1997 | Wuu et al. | |
| 5,693,376 | 12/1997 | Fetherston et al. | |
| 5,700,727 | 12/1997 | Manning | |
| 5,744,202 | 4/1998 | Nickel | 438/475 |

OTHER PUBLICATIONS

Hu, *Appl. Phys. Lett.* 69(4), Jul. 22, 1996, pp. 485–487.
*Silicon Processing for the VSLI Era*—vol. II, 1990, pp. 16–27.

*Primary Examiner*—Savitri Mulpuri
*Attorney, Agent, or Firm*—Killworth, Gottman, Hagan & Schaeff, L.L.P.

[57] ABSTRACT

A method for controlling the morphology of deposited silicon on a layer of silicon dioxide and semiconductor devices incorporating such deposited silicon are provided. The method comprises the steps of: providing a layer of silicon dioxide; implanting hydrogen ions into the layer of silicon dioxide by plasma source ion implantation; and forming a layer of polycrystalline silicon on the layer of silicon dioxide.

8 Claims, 4 Drawing Sheets

//6,143,631

METHOD FOR CONTROLLING THE MORPHOLOGY OF DEPOSITED SILICON ON A SILICON DIOXIDE SUBSTRATE AND SEMICONDUCTOR DEVICES INCORPORATING SUCH DEPOSITED SILICON

The present invention relates to a method for pretreating a silicon dioxide film to provide a polycrystalline silicon film, which is subsequently deposited on the silicon dioxide film, with a smooth morphology.

BACKGROUND OF THE INVENTION

Advancements in semiconductor manufacture have led to increases in the density and miniaturization of microelectronic circuits. As an example, the manufacture of 64 Mb DRAMs is now possible and 256 Mb prototypes are currently being developed. A key requirement for achieving such high device packing density is the formation of increasingly smaller components. One way to make such smaller components is to employ thinner and smoother films when fabricating those components.

Currently in the art, silicon dioxide films are pretreated with hydrogen ions to prepare the surface of the silicon dioxide film for the deposition of a layer of polycrystalline silicon to provide for a thinner and smoother polycrystalline silicon film. The silicon dioxide is pretreated by ion beam bombardment by a Kaufman ion source. Hydrogen ion beam pretreatment is typically performed using a Kaufman ion beam source directed normally to the substrate. A Kaufman ion source employs a metal grid to accelerate ions at a particular target. During an ion implantation process using a Kaufman ion source, metal from the metal grid sputters off of the grid and becomes implanted in the target object causing the target object to become contaminated. As the size of devices on the target object decreases, the effect of damage caused by sputtered metal from the metal grid increases.

Plasma source ion implantation (PSII) has been used to dope various materials, such as tools, aluminum cans and artificial joints, to improve their wear, friction and corrosion properties. PSII is a process by which ions are implanted into a target at energies high enough to bury the ions below the target's surface. To implant the ions in the target, an ionized plasma is formed about the target in an enclosed chamber. A high voltage pulse is applied to the target relative to the conductive walls of the chamber. Ions from the plasma are then driven into the surfaces of the target from all sides simultaneously without any manipulation of the target.

U.S. Pat. No. 4,764,394 to Conrad teaches one method and apparatus for PSII. Conrad describes that plasma source ion implantations may be performed on complex three-dimensional objects formed from materials such as pure metals, alloys, semi-conductors, ceramics and organic polymers. Conrad describes the process as providing significant increases in surface hardness of metals and ceramics and providing changes in the optical properties and electrical conductivity of organic polymers.

U.S. Pat. No. 5,354,381 to Sheng teaches a plasma immersion ion implantation apparatus which generally is a variation of the apparatus taught by Conrad. The Sheng apparatus uses a pair of power supplies and very short ionization negative pulses applied to the cathode underlying the target in conjunction with or followed by short ionization pulses applied to a second cathode which is facing toward the primary (target) electrode to provide neutralizing electrons.

Thus, a need has developed in the art for a process by which silicon dioxide films can be pretreated to ensure that a subsequently deposited polycrystalline silicon film will be provided with a smooth morphology but without the contamination problems of present processes.

SUMMARY OF THE INVENTION

The present invention solves that current need by providing a method by which a silicon dioxide film is prepared so that a subsequently deposited polycrystalline film is deposited smoothly and uniformly onto the silicon dioxide film.

One aspect of the present invention is directed to a method for controlling the morphology of deposited silicon on a layer of silicon dioxide. The method comprises the steps of: providing a layer of silicon dioxide; implanting hydrogen ions into the layer of silicon dioxide by plasma source ion implantation; and forming a layer of polycrystalline silicon on the layer of silicon dioxide.

Another aspect of the present invention is directed to a method for pretreating silicon dioxide comprising the steps of: providing a layer of silicon dioxide; and implanting hydrogen ions into a surface of the layer of silicon dioxide by plasma source ion implantation.

Yet another aspect of the present invention is directed to a method for forming a semiconductor device precursor comprising the steps of: providing a semiconductor substrate; forming a layer of silicon dioxide on the semiconductor substrate; implanting hydrogen ions by plasma source ion implantation into the layer of silicon dioxide; and forming a layer of polycrystalline silicon on the layer of silicon dioxide.

Still another aspect of the present invention is directed to a method for forming a semiconductor device precursor comprising the steps of: providing a semiconductor substrate; forming a layer of silicon dioxide on said semiconductor substrate; exposing said semiconductor substrate to a hydrogen plasma containing hydrogen ions; and applying a high voltage pulse to said semiconductor substrate thereby implanting hydrogen ions from said ionized hydrogen plasma into a surface of said layer of silicon dioxide so that a subsequently formed layer of polycrystalline silicon has a smooth morphology.

An additional aspect of the present invention is directed to a method for forming a semiconductor device precursor comprising the steps of: providing a semiconductor substrate; forming a layer of silicon dioxide on said semiconductor substrate; exposing said semiconductor substrate to a hydrogen plasma containing hydrogen ions; applying a high voltage pulse to said semiconductor substrate to implant hydrogen ions from said ionized hydrogen plasma into a surface of said layer of silicon dioxide so that a subsequently formed layer of polycrystalline silicon has a smooth morphology; and forming a layer of polycrystalline silicon on said surface of said layer of silicon dioxide.

A further aspect of the present invention is directed to a method for forming a semiconductor device comprising the steps of: providing a semiconductor substrate; forming a layer of silicon dioxide on the semiconductor substrate; implanting hydrogen ions by plasma source ion implantation into the layer of silicon dioxide; and forming a layer of polycrystalline silicon on the layer of silicon dioxide.

Another aspect of the present invention is directed to a method for forming a field effect transistor comprising the steps of: providing a semiconductor substrate having a layer of silicon dioxide formed thereon; implanting hydrogen ions by plasma source ion implantation into the layer of silicon dioxide; forming a layer of polycrystalline silicon on the layer of silicon dioxide; and forming a source, a drain and a gate in the semiconductor substrate to form a field effect transistor.

Still another aspect of the present invention is directed to a method for forming a memory array. The memory array includes a plurality of memory cells arranged in rows and columns with each of the plurality of memory cells including at least one field effect transistor. This method comprises the steps of: providing a semiconductor substrate; forming a layer of silicon dioxide on at least a portion of the semiconductor substrate; implanting hydrogen ions into at least a portion of the layer of silicon dioxide by plasma source ion implantation; forming a layer of polycrystalline silicon over at least the portion of the layer of silicon dioxide into which the hydrogen ions were implanted; and forming a gate, a source and a drain for each of the field effect transistors, on the semiconductor substrate.

Yet another aspect of the present invention is directed to a semiconductor device precursor. The semiconductor device precursor includes a semiconductor substrate. A layer of silicon dioxide is formed on the semiconductor substrate. The layer of silicon dioxide has been doped with hydrogen ions deposited by a plasma source ion implantation process to provide a subsequently deposited layer of polycrystalline silicon with a smooth morphology. Finally, a layer of polycrystalline silicon is formed on the layer of silicon dioxide.

An additional aspect of the present invention is directed to a field effect transistor. The field effect transistor includes a semiconductor substrate. A layer of silicon dioxide is formed on at least a portion of the semiconductor substrate. The layer of silicon dioxide has hydrogen ions implanted therein by plasma source ion implantation. A layer of polycrystalline silicon is formed on at least a portion of the layer of silicon dioxide. A source, a drain and a gate are also formed in the semiconductor substrate to complete the field effect transistor.

Still yet another aspect of the present invention is directed to a memory array. The memory array comprises a semiconductor substrate. A layer of silicon dioxide is formed on at least a portion of the semiconductor substrate. The layer of silicon dioxide has hydrogen ions implanted into at least a portion of the layer of silicon dioxide by plasma source ion implantation. A layer of polycrystalline silicon is formed over at least the portion of the layer of silicon dioxide into which the hydrogen ions were implanted. A plurality of memory cells are arranged in rows and columns on the semiconductor substrate. Each of the plurality of memory cells comprises at least one field effect transistor. Gates, sources and drains for each of the field effect transistors are also formed on the semiconductor substrate.

A still further aspect of the present invention is directed to a semiconductor wafer. The wafer comprises a wafer including a semiconductor substrate. The wafer is divided into a plurality of die. A layer of silicon dioxide is formed on at least a portion of the semiconductor substrate. On each of the plurality of die the layer of silicon dioxide has hydrogen ions implanted into at least a portion of the layer of silicon dioxide by plasma source ion implantation. A layer of polycrystalline silicon is formed over at least the portion of the layer of silicon dioxide into which the hydrogen ions are implanted. The wafer also includes a repeating series of gates, sources and drains for at least one field effect transistor formed on each of the plurality of die. The series of gates, sources and drains are formed on the semiconductor substrate.

Another aspect of the present invention is directed to a method for making a thin film transistor. The method comprises the steps of: providing a semiconductor substrate formed from a material selected from the group consisting of silicon dioxide, quartz and glass; forming a layer of a gate oxide material in the semiconductor substrate; implanting, by plasma source ion implantation, hydrogen ions into a surface of the semiconductor substrate; forming a layer of polycrystalline silicon on the surface of the semiconductor substrate; forming a layer of an insulating material on the layer of polycrystalline silicon; and forming a source region, a drain region and a gate electrode.

Still another aspect of the present invention is directed to a thin film transistor. The thin film transistor includes a semiconductor substrate formed from a material selected from the group consisting of silicon dioxide, quartz and glass. The semiconductor substrate has hydrogen ions implanted therein by plasma source ion implantation. A layer of polycrystalline silicon is formed on at least a portion of semiconductor substrate. A layer of a insulating material is formed on at least a portion of the layer of polycrystalline silicon. A source region and a drain region are formed on the layer of polycrystalline silicon. Finally, a gate electrode is formed on the layer of insulating material.

It is an object of the present invention to provide a method by which a layer of silicon dioxide, which serves as either a semiconductor substrate or another layer on the substrate, can be pretreated so that a subsequently deposited film of polycrystalline silicon can be deposited on the layer of silicon dioxide free of contaminants and have a smooth morphology. It is also object of the present invention to provide various semiconductor parts and devices which include a layer of polycrystalline silicon having a smooth morphology.

Other objects and advantages of the invention will be apparent from the following detailed description, the accompanying drawings and the appended claims.

DETAILED DESCRIPTION OF THE PREFERRED EMBODIMENTS

Figure 1:
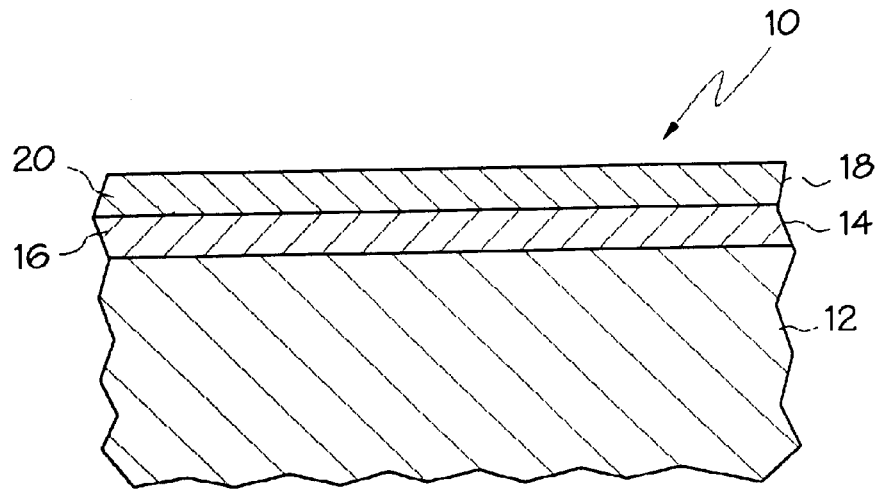
FIG. 1 presents a cross sectional view of semiconductor device precursor formed by the method of the present invention.
Figure 5:
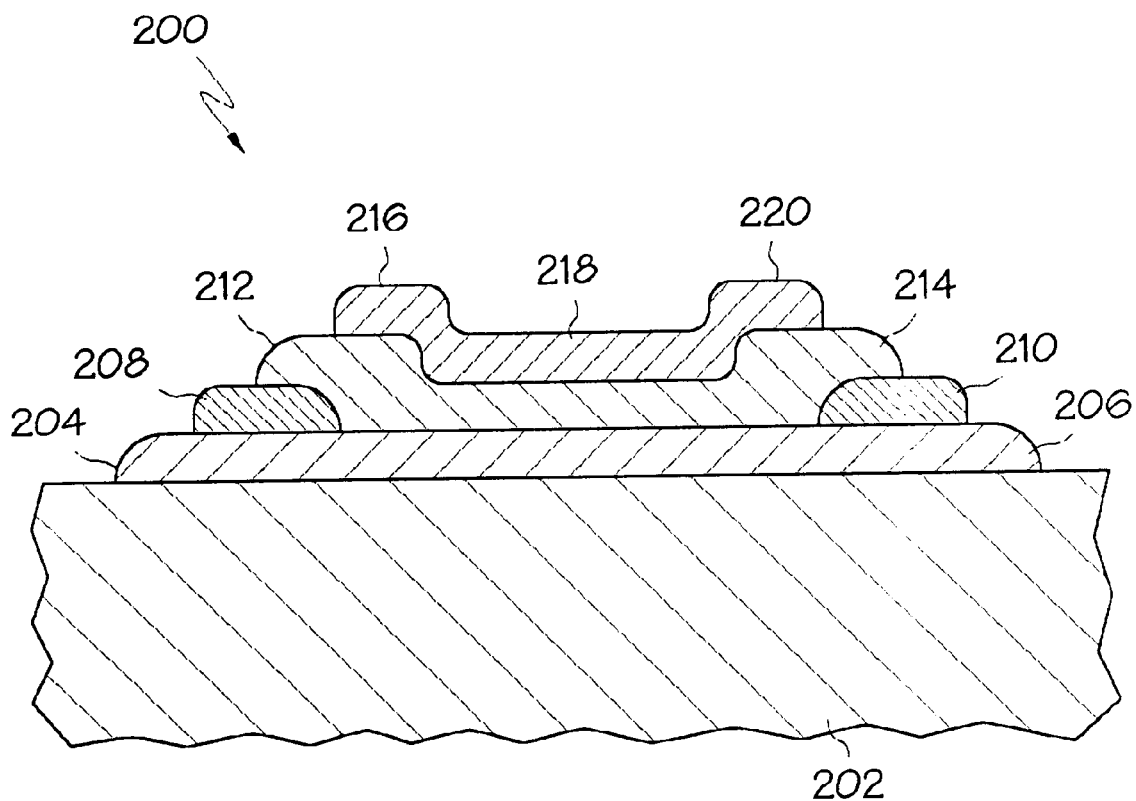
FIG. 5 presents a cross sectional view of a thin film transistor formed by the method of the present invention.

A semiconductor device precursor 10 formed by the method of the present invention is shown in FIG. 1. The precursor 10 includes a semiconductor substrate 12, a layer 14 of silicon dioxide 16 and a layer 18 of polycrystalline silicon 20. The substrate 12 can be formed of any material currently in use in the art to form substrates for semiconductors and integrated circuits. For example, the substrate 12 can be formed from silicon which can be oxidized to form the layer 14 of silicon dioxide 16. Other useful materials for substrate 12 include, but are not limited to, gallium arsenide, indium phosphide, polycrystalline silicon, silicon dioxide, glass and quartz. Glass, quartz and silicon dioxide are particularly useful if the precursor 10 is further processed into a thin film transistor, such as that described below in connection with FIG. 5.

With continued reference to FIG. 1, the layer 14 of silicon dioxide 16 is formed on the substrate 12 by any conventional oxidation process or deposition process, and has been doped with hydrogen ions to provide a surface conducive to the deposition of polycrystalline silicon. Depending upon the nature of the layer 14 of silicon dioxide 16, the layer 14 of silicon dioxide 16 can be formed by thermal oxidation, chemical vapor deposition (CVD), low pressure chemical vapor deposition (LPCVD), plasma enhanced chemical vapor deposition (PECVD), metalorganic chemical vapor deposition (MOCVD), and sputtering. The layer 18 of polycrystalline silicon 20 is formed on the layer 14 of silicon dioxide 16 by any deposition process currently used in the art to form a layer of polycrystalline silicon on a layer of silicon dioxide. Useful deposition methods include, but are not limited to, thermal oxidation, CVD, LPCVD, PECVD, MOCVD and sputtering.

The layer 14 of silicon dioxide 16 is doped by plasma source ion implantation (PSII). Plasma source ion implantation is also referred to as plasma doping (PLAD), plasma immersion ion implantation ($PI^3$) and plasma implantation (PI). As used herein, the term "plasma source ion implantation" incorporates and encompasses "plasma doping," "plasma implantation," and "plasma immersion ion implantation." A useful plasma source ion implantation technique and device are taught in U.S. Pat. No. 4,764,394 to Conrad, which is incorporated herein by reference in its entirety. Using the Conrad technique, the substrate 12 is placed in a chamber which has walls formed from an electrically conductive material. The substrate 12 is placed on an arm which is electrically connected to a high voltage pulse power supply, such as a pulse line-pulse transformer type or a high voltage tube modulated pulser. The chamber is filled with hydrogen gas under a very low pressure in the range of form about $10^{-1}$ to about $10^{-4}$ Torr. The gas is; then ionized to form a plasma containing hydrogen ions. The plasma can be generated by any of a variety of plasma sources, including, but not limited to, hot filament, radio frequency, electron cyclotron resonance, magneton and glow discharge resulting from the target bias itself. A large negative pulse with respect to the chamber is applied to the substrate 12 to accelerate ions from the plasma toward the layer 14 of silicon dioxide 16, to create a plasma sheath around the substrate 12, and to implant the ions into the layer 14 of silicon dioxide 16. A plasma density, useful for implanting an appropriate amount of hydrogen ions into the layer 14, ranges from about $10^6$ ions/cm$^3$ to about $10^{11}$ ions/cm$^3$.

Another useful plasma source ion implantation apparatus and technique is described in U.S. Pat. No. 5,354,381 to Sheng which is also incorporated herein by reference in its entirety. The Sheng patent describes a technique in which a "cold" cathode is used to generate the hydrogen plasma. In this process, the substrate 12 is mounted on a electrode, which is positioned in a wall of an implantation chamber. A pulsed negative voltage is applied to the electrode which creates electric field lines with the walls of the chamber. These electric field lines cause a hydrogen gas, which has been introduced into the chamber, to ionize and causes positive ions from the hydrogen gas to be accelerated toward the substrate 12 and to become implanted into the substrate 12.

After the hydrogen ions have been implanted into the layer 14 of silicon dioxide 16, the layer 18 of polycrystalline silicon 20 is formed on the layer 14. The layer 18 of polycrystalline silicon 20 is formed on the layer 14 by any deposition method currently in use in the art. Useful deposition methods include, but are not limited to, thermal oxidation, CVD, LPCVD, PECVD, MOCVD and sputtering.

By implanting hydrogen ions into the layer 14 of silicon dioxide 16 by plasma source ion implantation, the resulting layer 18 of polycrystalline silicon 20 is provided with a smooth morphology. By "smooth", it is meant that, when the layer 18 is measured by atomic force microscopy, the layer 18 of polycrystalline silicon 20 has a root mean square (rms) deviation of from about 5 nm to about 12 nm. The method of the present invention provides a layer 18 of polycrystalline silicon 20 which is smoother than either a layer of polycrystalline silicon deposited on a non-treated layer of silicon dioxide (rms=22 nm) or a layer of polycrystalline silicon deposited on a layer of silicon dioxide pretreated with an $H_2$ gas bake (rms=33 nm). While not wishing to be bound by a particular theory, it is believed that the implantation of the hydrogen ions in the silicon dioxide substrate increases the number of nucleation sites for polycrystalline silicon deposition thus affecting the morphology of the subsequently deposited layer of polycrystalline silicon.

Unlike a Kaufman ion source implantation technique, a plasma source ion implantation apparatus does not employ a metal grid to accelerate the hydrogen ions toward the target object but instead uses the target object itself, in this case the substrate 12, to accelerate the ions toward the target object. Thus, plasma source ion implantation reduces the possibility of contamination of the target object by eliminating a device which employs a metal grid. Further, plasma source ion implantation can be used on smaller devices or substrates than a Kaufman ion source without increasing the likelihood for contamination of the target object.

The semiconductor device precursor 10 of the present invention can be used to form any semiconductor device which requires that a layer of polycrystalline silicon be formed over a layer of silicon dioxide. Exemplary semiconductor devices which can be formed from the semiconductor precursor 10 include, but are not limited to, field effect transistors, thin film transistors, dynamic random access memory devices (DRAMs), static random access memory devices (SRAMs), memory arrays and semiconductor wafers.

Figure 2:
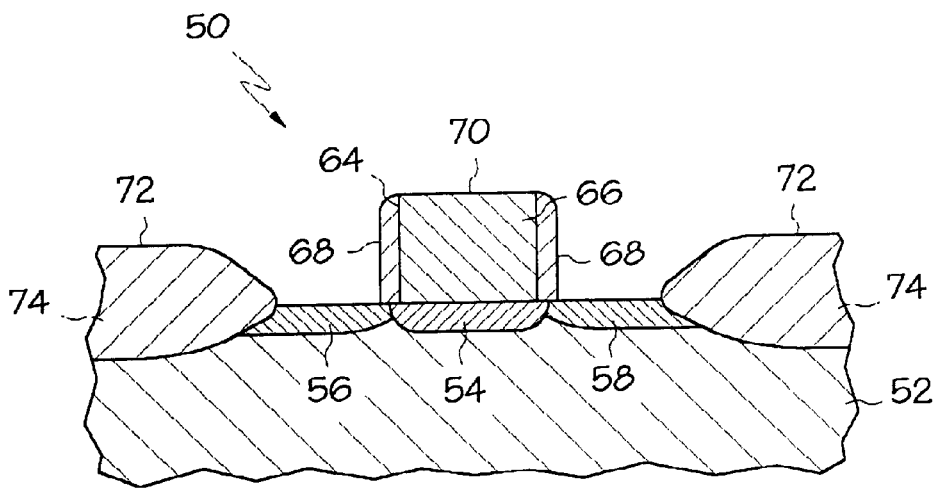
FIG. 2 presents a cross sectional view of a field effect transistor formed by the method of the present invention.

FIG. 2 presents a cross sectional view of a field effect transistor 50 formed by the method of the present invention. The field effect transistor 50 is formed on a semiconductor substrate 52, which is desirably silicon dioxide, quartz or glass. The field effect transistor 50 includes a gate oxide 54, a source 56 and a drain 58. The gate oxide 54, the source 56 and the drain 58 are formed in the substrate 52. A layer 64 of polysilicon 66 is formed on the gate oxide 54 to form a gate electrode 70. A pair of spacers 68 are formed on the sides of the layer 64 of polysilicon 66. A layer 72 of a field oxide 74 is also formed on the substrate 52.

The substrate 52 can be formed of any material currently in use in the art to form substrates for semiconductors and integrated circuits. Desirably, the substrate 52 is formed from silicon which can be oxidized to form the layer 72 of field oxide material 74. Other useful substrates 52 include, but are not limited to, gallium arsenide, indium phosphide, polycrystalline silicon, germanium, silicon dioxide, glass and quartz. As used herein, the term "substrate" is not limited to bulk substrate materials but can also denote thinner substrates such as those used to form thin film transistors. One skilled in the art will appreciate that substrate 52 can be layer or part of a larger semiconductor device.

Figure 2A:
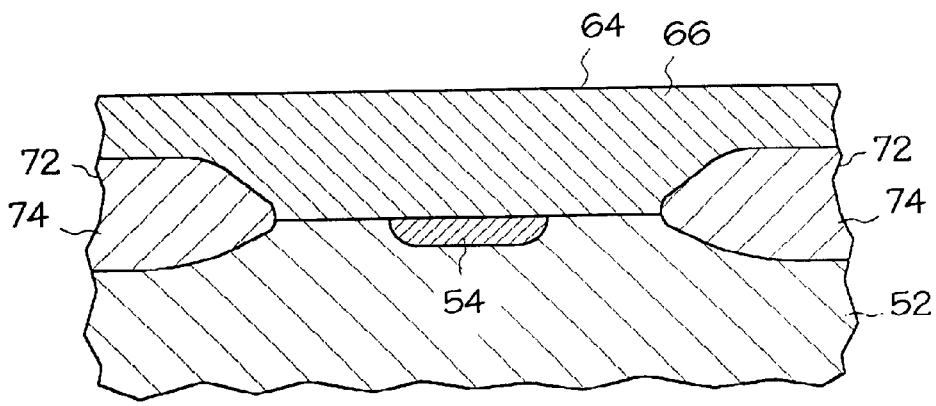
FIGS. 2A–2C present cross sectional views of various stages in the manufacture of the field effect transistor shown in FIG. 2.
Figure 2B:
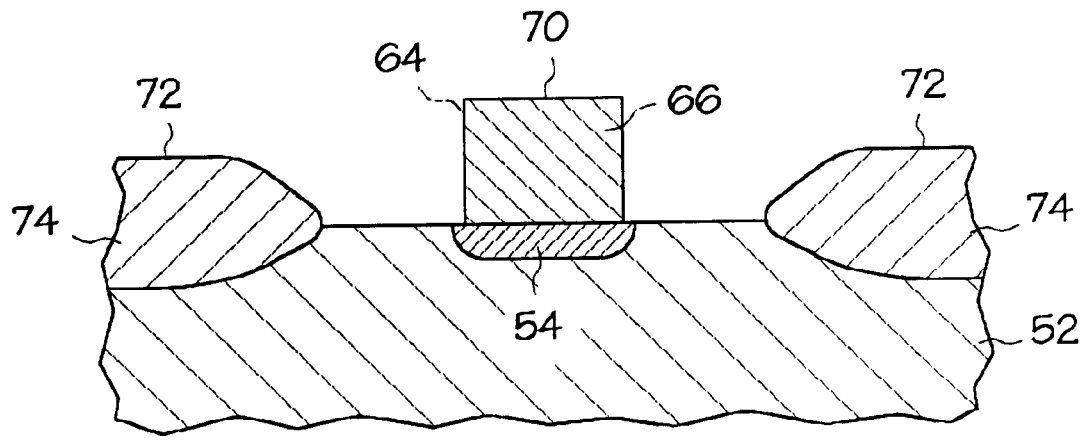
Figure 2C:
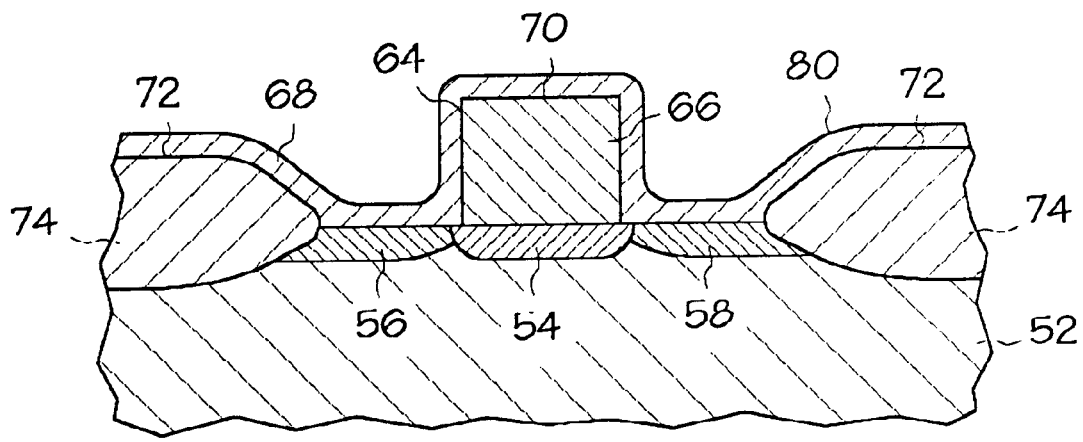

A method for making the field effect transistor 50 is shown in FIGS. 2A–2C. As an initial step, the layer 72 of the field oxide 74 is formed on the substrate 52 by means of a conventional local oxidation of silicon (LOCOS) process. Next, a gate oxide 54 is formed in substrate 52. The surface of the substrate 52 is then conditioned or pretreated so that the subsequently formed layer 64 of polycrystalline silicon 66 has a smooth morphology. The surface of the substrate 52 is pretreated by implanting hydrogen ions into the surface of the substrate 52 through plasma source ion implantation by the method described above. FIG. 2A shows a layer 64 of polysilicon 66 having been formed on the surface of the substrate 52. The layer 64 of polysilicon 66 covers and, as shown in FIG. 2A, is in contact with the gate oxide 54.

As shown in FIG. 2B, after the layer 64 of polycrystalline silicon 66 has been formed on the surface of the substrate 52, the layer 64 is etched to form the gate electrode 70. The gate electrode 70 is formed by any conventional masking and etching techniques currently in use in the art.

As shown in FIG. 2C, the source 56 and the drain 58 are formed by any conventional conductive doping technique currently in use in the art. Desirably, the source 56 and the drain 58 are formed by a self aligned technique. After the source 56 and the drain 58 have been formed, a layer 80 of a dielectric material 68 is formed on the gate 54 and over the source 56 and drain 58. Typically, but not necessarily, the layer 80 will be a layer of an oxidized material and is provided at a thickness such that it serves as an insulating layer. Any material used in the art to form spacers would be useful for forming the layer 80 of dielectric material 68. Desirably, the dielectric material 68 is silicon dioxide or silicon nitride. The resulting field effect transistor 50 is shown in FIG. 2.

Figure 3:
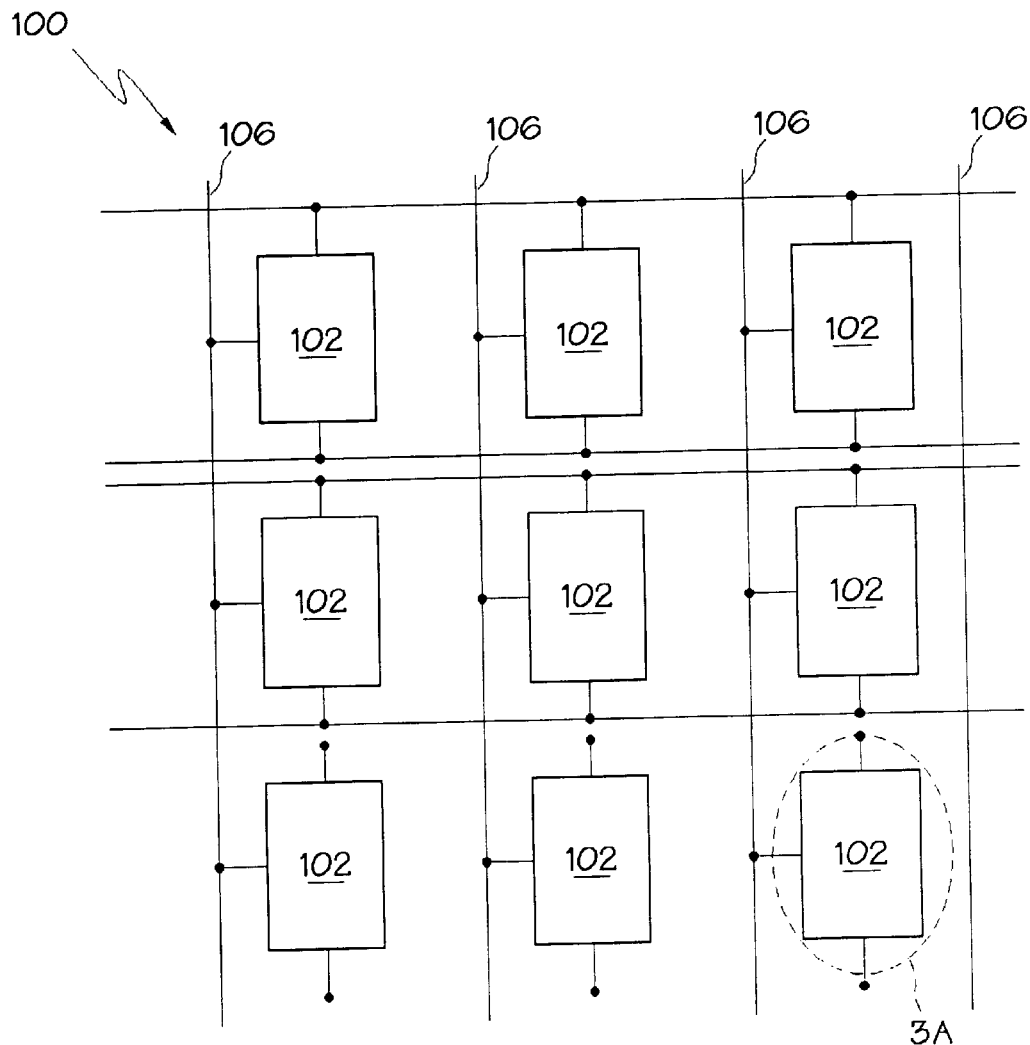
FIG. 3 shows a schematic view of a memory array formed by the method of the present invention.
Figure 3A:
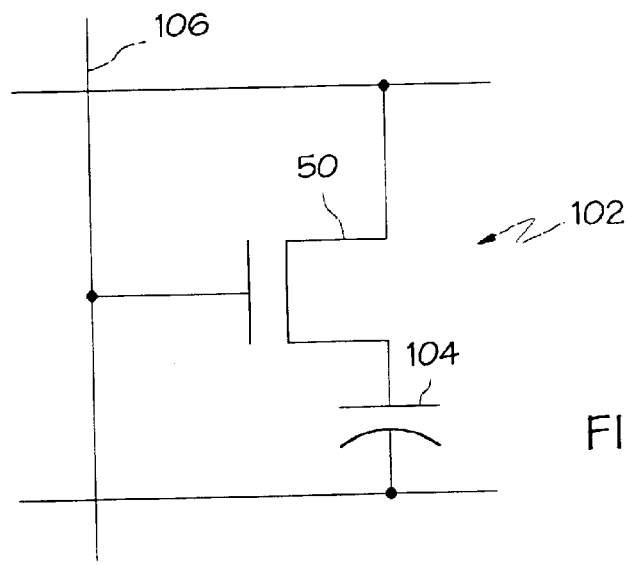
FIG. 3A shows a schematic view of a memory cell of the memory array shown in FIG. 3.

The field effect transistor 50 may also be used in a typical memory array, such as, for example, a static random access memory (SRAM) array or a dynamic random access memory (DRAM) array 100, which is shown in FIG. 3. The DRAM array 100 comprises a plurality of memory cells 102 arranged in rows and columns. As shown in FIG. 3A, each of the memory cells 102 includes at least one field effect transistor 50 and one capacitor 104. The field effect transistor 50 may be the field effect transistor 50, described above and shown in FIG. 2. The method for forming the field effect transistor 50 is described above in connection with the description of FIGS. 2A to 2C. Each field effect transistor 50 is coupled to a capacitor 104. The gate of the field effect transistor 50 is coupled to a word line 106 via an interconnect structure. It should be apparent that other devices such as other transistors, bipolar transistors, resistors, other capacitors and the like, may be interconnected with the field effect transistor 50.

Figure 4:
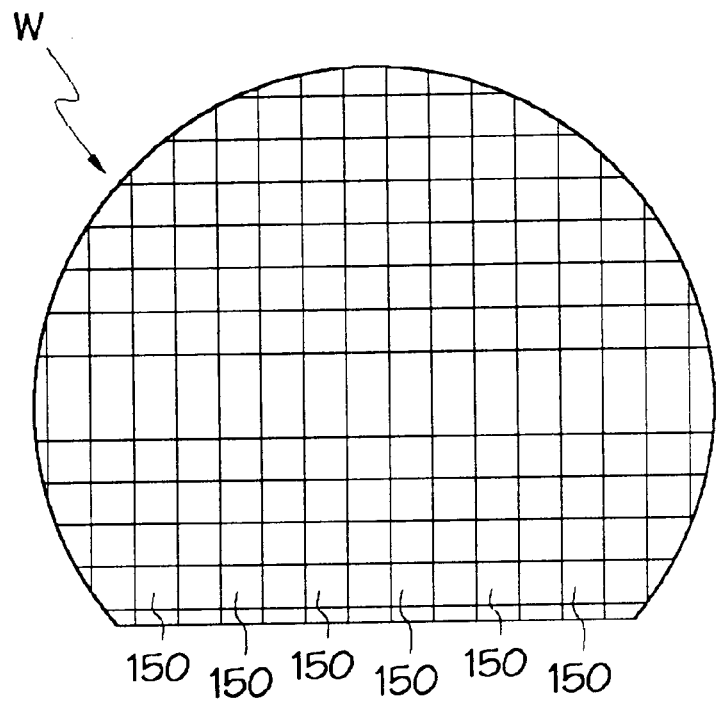
FIG. 4 shows a schematic view of a wafer manufactured by the method of the present invention.

The field effect transistor 50 of the present invention may also used in the fabrication of a wafer W, as is shown in FIG. 4. The wafer W includes a plurality of individual die 150 formed on a semiconductor substrate, such as substrate 52. Wafer masks (not shown) are used to apply a desired circuit structure on each of the individual die 150. The desired circuit structure may comprise any of the above described structures, e.g., the DRAM array 100 or an SRAM array. The wafer W is processed using standard wafer fabrication =techniques.

The semiconductor device precursor 10 and the method of the present invention are particularly useful in forming thin film transistors and, particularly, thin film transistors which are used to make flat panel displays. By providing the layer of polycrystalline silicon with a smoother morphology, a thinner layer of polycrystalline silicon is formed on the substrate. The final structure of the thin film transistor would be thinner due to the thinner polycrystalline silicon layer and to the layers which are subsequently deposited on the polycrystalline silicon also being thinner.

A thin film transistor 200 is shown in cross section in FIG. 3. The thin film transistor 200 includes an insulating substrate 202. A layer 204 of a semiconducting material 206 is formed on the surface of the substrate 202. A source region 208 and a drain region 210 are formed on the layer 204 of semiconducting material 206. A layer 212 of a dielectric material 214 is formed on the layer 204 of semiconducting material 206 and covers the source 208 and the drain 210. A layer 216 of a conducting material 218 is formed on the layer 212 of dielectric material 214 to form a gate electrode 220.

The insulating substrate 202 can be any material used to form insulating layers in semiconductor devices and is preferably glass, quartz or silicon dioxide. Rather than doping a layer of silicon dioxide which is subsequently deposited on a substrate as when forming a field effect transistor and as described above, when the thin film transistor 200 is being formed, the insulating substrate 202, itself, is doped with hydrogen ions by the plasma source ion implantation technique described above.

After the insulating substrate 202 has been doped with hydrogen ions, the layer 204 of semiconducting material 206 is formed on the substrate 202 by any conventional deposition process. Useful deposition methods include, but are not limited to, thermal oxidation, CVD, LPCVD, PECVD, MOCVD and sputtering. Desirably, the layer 204 is deposited by a thermal oxidation process. The layer 204 of semiconducting material 206 can be any material used to form semiconducting layers, including, but are not limited to, gallium arsenide, indium phosphide, polycrystalline silicon, and germanium. Desirably, the layer 204 of semiconducting material 206 is formed from polycrystalline silicon. Once the layer 204 of semiconducting material 206 has been formed, the layer 204 is etched to isolate the various regions of semiconducting material from each other on the surface of the substrate 202.

After the various regions of semiconducting material 204 have been formed on the substrate 202, the source region 208 and the drain region 210 are formed on the layer 204 of semiconducting material 206. The source region 208 and the drain region 210 can either be formed in the layer 204 of semiconducting material 206 or formed in the layer 212 of dielectric material 214. The source region 208 and the drain region 210 are formed by any doping technique currently in use in the art. The layer 212 of dielectric material 214 is deposited on the layer 204 of semiconducting material 206. Useful deposition methods include, but are not limited to, thermal oxidation, CVD, LPCVD, PECVD, MOCVD and sputtering. The layer 212 of dielectric material 214 can be any material used in the semiconductor manufacturing art to form dielectric layers. Desirably, the dielectric material 214 is silicon dioxide or silicon nitride.

As a final step, a layer 216 of a conducting material 218 is formed on the layer 212 of dielectric material 214. The layer 216 is formed in any manner currently used in the art to form such layers. Useful deposition methods include, but are not limited to, thermal oxidation, CVD, LPCVD, PECVD, MOCVD and sputtering. The conducting material 218 is selected from the group consisting of polycrystalline silicon, metal and any conducting material. The layer 216 of conducting material 218 forms the gate electrode 220.

One skilled in the art will appreciate that the method of the present invention can be carried out as a stand-alone process, clustered as part of the semiconductor manufacturing process or as an in situ pretreatment.

Having described the invention in detail and by reference to preferred embodiments thereof, it will be apparent that modifications and variations are possible without departing from the scope of the invention which is defined in the appended claims.

What is claimed is:

1. A method for controlling the morphology of deposited silicon on a silicon dioxide substrate comprising the steps of:

providing a layer of silicon dioxide;

implanting hydrogen ions into said layer of silicon dioxide by plasma source ion implantation; and forming a layer of polycrystalline silicon in contact with said layer of silicon dioxide having hydrogen ions implanted therein such that said layer of polycrystalline silicon has a smooth morphology.

2. A method for pretreating silicon dioxide comprising the steps of:

providing a layer of silicon dioxide; and implanting hydrogen ions into a surface of said layer of silicon dioxide by plasma source ion implantation to provide nucleation sites for a subsequent layer of deposited polycrystalline silicon such that said layer of polycrystalline silicon has a smooth morphology.

3. A method for forming a semiconductor device precursor comprising the steps of:

providing a semiconductor substrate;

forming a layer of silicon dioxide on said semiconductor substrate;

exposing said semiconductor substrate to a hydrogen plasma containing hydrogen ions; and applying a high voltage pulse to said semiconductor substrate thereby implanting hydrogen ions from said ionized hydrogen plasma into a surface of said layer of silicon thereon dioxide so that a subsequently formed layer of polycrystalline silicon has a smooth morphology.

4. A method for forming a semiconductor device precursor comprising the steps of:

providing a semiconductor substrate;

forming a layer of silicon dioxide on said semiconductor substrate;

exposing said semiconductor substrate to a hydrogen plasma containing hydrogen ions;

applying a high voltage pulse to said semiconductor substrate to implant hydrogen ions from said ionized hydrogen plasma into a surface of said layer of silicon dioxide so that a subsequently formed layer of polycrystalline silicon has a smooth morphology; and forming a polycrystalline silicon film in contact with said surface of said layer of silicon dioxide.

5. A method for forming a semiconductor device comprising the steps of:

providing a semiconductor substrate;

forming a layer of silicon dioxide on said semiconductor substrate;

implanting hydrogen ions by plasma source ion implantation into said layer of silicon dioxide; and forming a layer of polycrystalline silicon in contact with said layer of silicon dioxide having hydrogen ions implanted therein such that said layer of polycrystalline silicon has a smooth morphology.

6. A method for forming a field effect transistor comprising the steps of:

providing a semiconductor substrate having a layer of silicon dioxide formed thereon;

implanting hydrogen ions by plasma source ion implantation into said layer of silicon dioxide;

forming a layer of polycrystalline silicon in contact with said layer of silicon dioxide having hydrogen ions implanted therein such that said layer of polycrystalline silicon has a smooth morphology; and forming a source, a drain and a gate in said semiconductor substrate.

7. A method for forming a memory array, said memory array comprising a plurality of memory cells arranged in rows and columns, each of said plurality of memory cells comprising at least one field effect transistor, said method comprising the steps of:

providing a semiconductor substrate;

forming a layer of silicon dioxide on at least a portion of said semiconductor substrate;

implanting hydrogen ions into at least a portion of said layer of silicon dioxide by plasma sources ion implantation;

forming a layer of polycrystalline silicon over and in contact with at least said portion of said layer of silicon dioxide into which said hydrogen ions were implanted such that said layer of polycrystalline silicon has a smooth morphology; and forming a gate, a source and a drain for each of said field effect transistors, on said semiconductor substrate.

8. A method for forming a thin film transistor comprising the steps of:

providing a semiconductor substrate formed from a material selected from the group consisting of silicon dioxide, quartz and glass;

forming a layer of a gate oxide material in said semiconductor substrate;

implanting, by plasma source ion implantation, hydrogen ions into a surface of said semiconductor substrate;

forming a layer of polycrystalline silicon on said surface of said semiconductor substrate having hydrogen ions implanted therein such that said layer of polycrystalline silicon has a smooth morphology;

forming a layer of an insulating material in contact with said layer of polycrystalline silicon;

forming a source region and a drain region; and forming a gate electrode on said layer of insulating material.

* * * * *

UNITED STATES PATENT AND TRADEMARK OFFICE
CERTIFICATE OF CORRECTION

PATENT NO.     : 6,143,631                                          Page 1 of 1
DATED          : November 7, 2000
INVENTOR(S)    : David L. Chapek It is certified that error appears in the above-identified patent and that said Letters Patent is hereby corrected as shown below:

<u>Column 7,</u>
Line 67, "fabrication = techniques" should be -- fabrication techniques --.

<u>Column 9,</u>
Line 44, "silicon thereon dioxide" should be -- silicon dioxide --.
Line 45, "silicon has a smooth" should be -- silicon thereon has a smooth --.

Signed and Sealed this

Sixteenth Day of October, 2001

*Attest:*

*Nicholas P. Godici*

NICHOLAS P. GODICI
*Attesting Officer*     *Acting Director of the United States Patent and Trademark Office*